(12) United States Patent
Kang et al.

(10) Patent No.: US 10,818,604 B2
(45) Date of Patent: Oct. 27, 2020

(54) SEMICONDUCTOR PACKAGE

(71) Applicant: SAMSUNG ELECTRONICS CO., LTD., Suwon-si (KR)

(72) Inventors: Myung Sam Kang, Gyeonggi-do (KR); Yong Jin Park, Gyeonggi-do (KR); Young Gwan Ko, Gyeonggi-do (KR); Moon Il Kim, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/414,016

(22) Filed: May 16, 2019

(65) Prior Publication Data

US 2020/0303314 A1 Sep. 24, 2020

(30) Foreign Application Priority Data

Mar. 18, 2019 (KR) .................... 10-2019-0030677

(51) Int. Cl.
*H01L 23/538* (2006.01)
*H01L 23/31* (2006.01)
*H01L 23/66* (2006.01)
*H01L 23/00* (2006.01)

(52) U.S. Cl.
CPC ...... *H01L 23/5389* (2013.01); *H01L 23/3128* (2013.01); *H01L 23/5383* (2013.01); *H01L 23/5386* (2013.01); *H01L 23/66* (2013.01); *H01L 24/20* (2013.01); *H01L 2223/6666* (2013.01); *H01L 2224/214* (2013.01); *H01L 2924/19041* (2013.01); *H01L 2924/19104* (2013.01)

(58) Field of Classification Search
None
See application file for complete search history.

(56) References Cited

U.S. PATENT DOCUMENTS

| 9,754,928 | B2 | 9/2017 | Chen et al. | |
|---|---|---|---|---|
| 9,768,133 | B1 | 9/2017 | Wu et al. | |
| 2018/0082964 | A1* | 3/2018 | Wu | H01L 21/56 |
| 2018/0145036 | A1* | 5/2018 | Kim, II | H01L 24/20 |
| 2018/0350747 | A1* | 12/2018 | Hwang | H01L 23/13 |

FOREIGN PATENT DOCUMENTS

KR 10-1885036 B1 8/2018

* cited by examiner

*Primary Examiner* — Thien F Tran
(74) *Attorney, Agent, or Firm* — Sughrue Mion, PLLC

(57) ABSTRACT

A semiconductor package includes a semiconductor chip having connection pads on one surface thereof, a first encapsulant covering at least portions of the semiconductor chip, and a connection structure disposed on the one surface of the semiconductor chip and including one or more redistribution layers electrically connected to the connection pads. A wiring structure is disposed on one surface of the first encapsulant opposing another surface of the first encapsulant facing towards the connection structure. The wiring structure has a passive component embedded therein, and includes one or more wiring layers electrically connected to the passive component. The one or more redistribution layers and the one or more wiring layers are electrically connected to each other.

19 Claims, 15 Drawing Sheets

I-I'

SEMICONDUCTOR PACKAGE

CROSS-REFERENCE TO RELATED APPLICATION(S)

This application claims benefit of priority to Korean Patent Application No. 10-2019-0030677 filed on Mar. 18, 2019 in the Korean Intellectual Property Office, the disclosure of which is incorporated herein by reference in its entirety.

BACKGROUND

1. Field

The present disclosure relates to a semiconductor package.

2. Description of Related Art

In order to cope with slimming of mobile devices, a development trend of mobile devices, a technology of reducing a height of a mobile dynamic random access memory (DRAM) package interworking with an application processor (AP) has been continuously developed. For example, thicknesses of a die, a die attach film (DAF), a printed circuit board (PCB), a wire bonding, a molding, and the like, related to the height, have been gradually reduced to reduce the height of the mobile DRAM package. However, related technology is expected to reach a limitation in reducing the height of the mobile DRAM package before too long. For example, in the case of a PCB, a limitation related to the thickness thereof is apparent, and thus, there is demand for preparation of a new structure to be used as redistribution patterns of semiconductors. Meanwhile, performance of a memory has improved and a driving voltage of the memory is reduced, such that using a decoupling capacitor in order to stabilize the driving voltage has been considered.

SUMMARY

An aspect of the present disclosure may provide a semiconductor package of which a thickness may be sufficiently reduced and in which electrical performance of a mounted memory package may be improved.

According to an aspect of the present disclosure, a semiconductor package may be provided, in which a wiring structure in which a passive component is embedded is disposed on an encapsulant so as to be integrated with the encapsulant.

According to an aspect of the present disclosure, a semiconductor package may include a semiconductor chip having connection pads on one surface there, a first encapsulant covering at least portions of the semiconductor chip, and a connection structure disposed on the one surface of the semiconductor chip on which the connection pads are disposed and including one or more redistribution layers electrically connected to the connection pads. A wiring structure is disposed on one surface of the first encapsulant opposing another surface of the first encapsulant facing towards the connection structure. The wiring structure has a passive component embedded therein, and includes one or more wiring layers electrically connected to the passive component. The one or more redistribution layers and the one or more wiring layers are electrically connected to each other.

According to another aspect of the present disclosure, a semiconductor package may include a connection structure having a first surface and a second surface opposing the first surface and including one or more redistribution layers, a semiconductor chip disposed on the first surface of the connection structure and having connection pads electrically connected to the redistribution layer, and an electrical connection member disposed on the first surface of the connection structure and providing a vertical electrical connection path. A first encapsulant is disposed on the first surface of the connection structure and covers at least portions of each of the semiconductor chip and the electrical connection member. A passive component is disposed on the first encapsulant, a second encapsulant is disposed on the first encapsulant and covers at least portions of the passive component, and a backside wiring layer is disposed on the second encapsulant. First wiring vias penetrate through the first and second encapsulants and electrically connect the backside wiring layer and the electrical connection member to each other, and second wiring vias penetrate through the second encapsulant and electrically connect the backside wiring layer and the passive component to each other.

According to a further aspect of the present disclosure, a semiconductor package includes a semiconductor chip having opposing first and second surfaces, and having connection pads in the first surface, an encapsulant disposed on the second surface of the semiconductor chip, and a wiring structure disposed on the encapsulant, having a passive component embedded therein, and including at least one conductive via penetrating therethrough and through the encapsulant.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
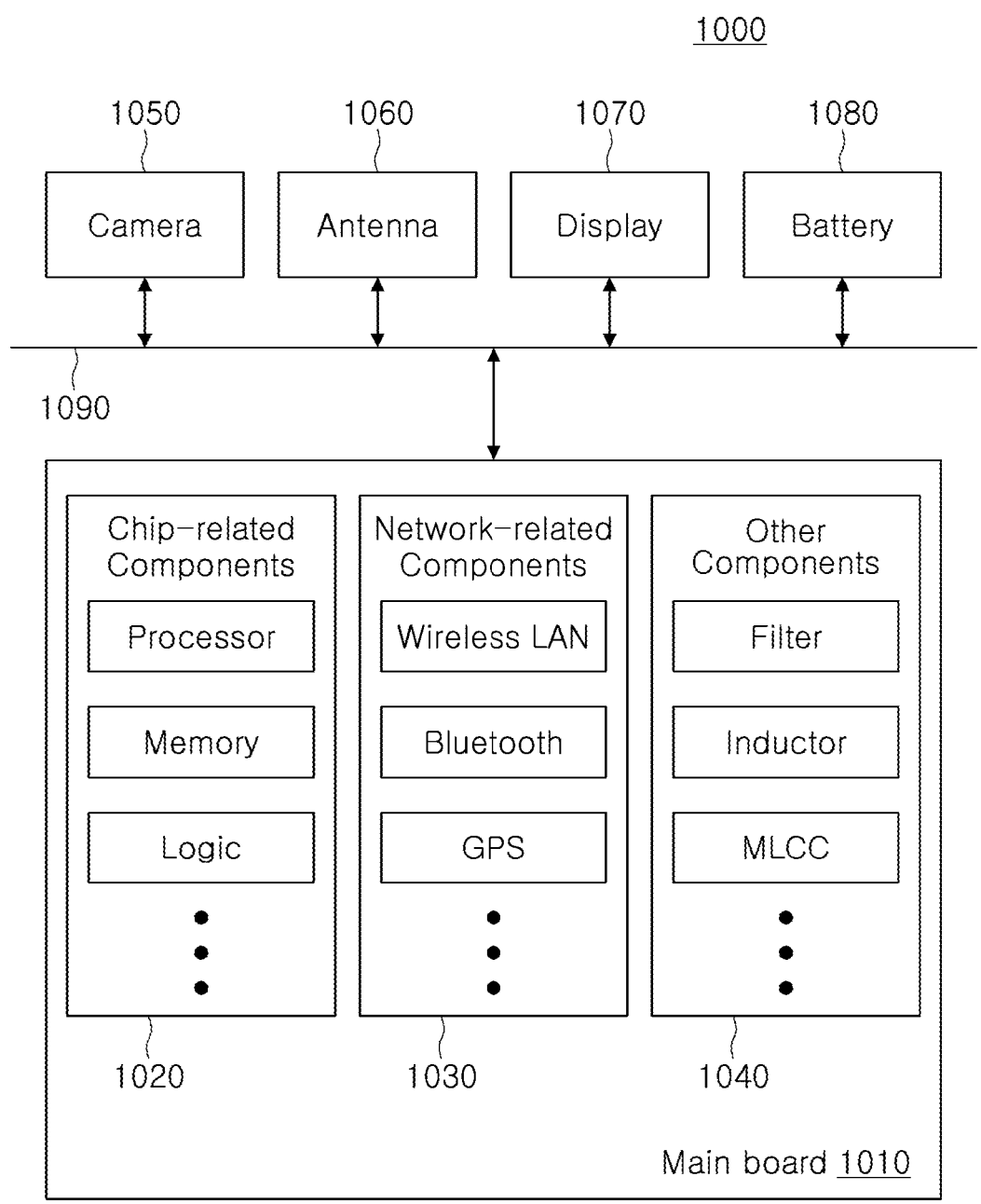
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip set related components 1020, network related components 1030, other components 1040, and the like, physically or electrically connected thereto. These components may be connected to others to be described below to form various signal lines 1090.

The chip set related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip set related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip set related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip set related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
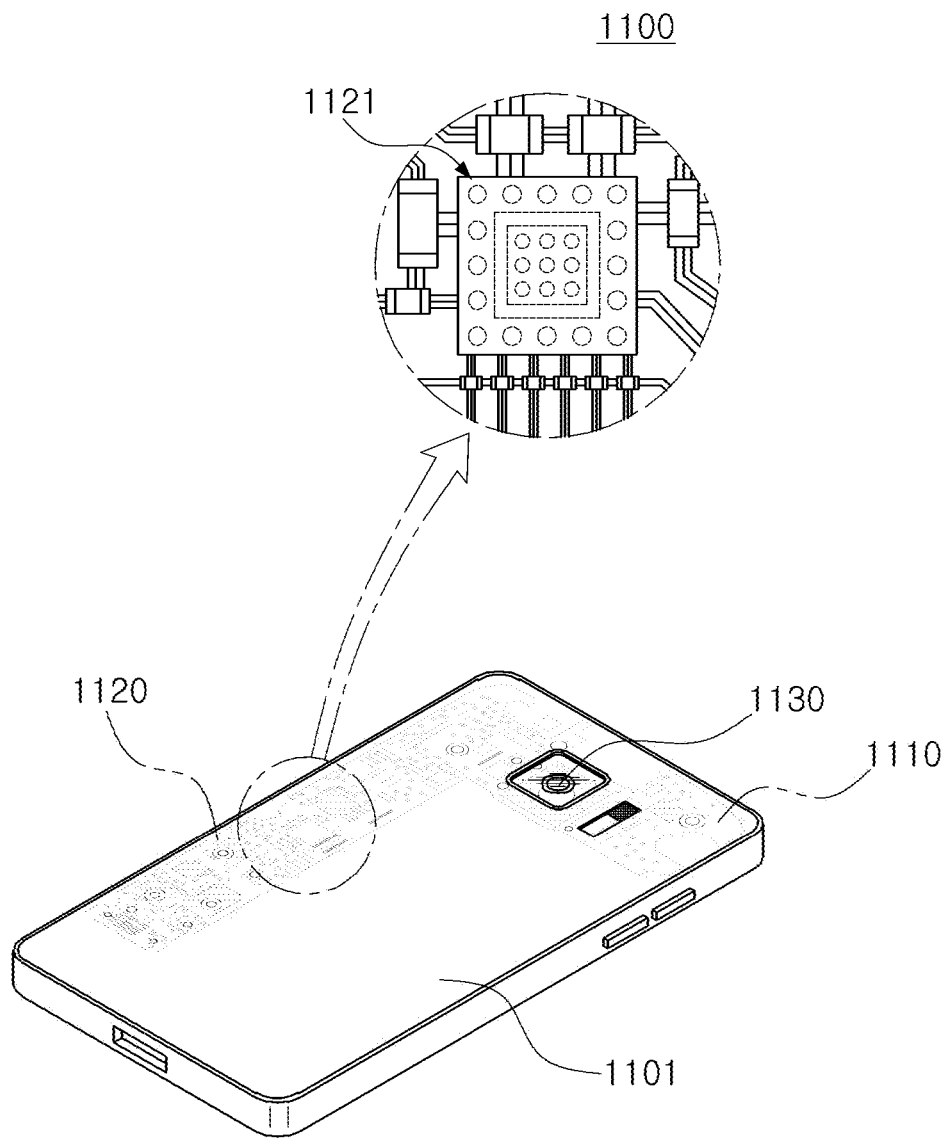
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a mainboard, or the like, may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip set related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is used due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is used.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
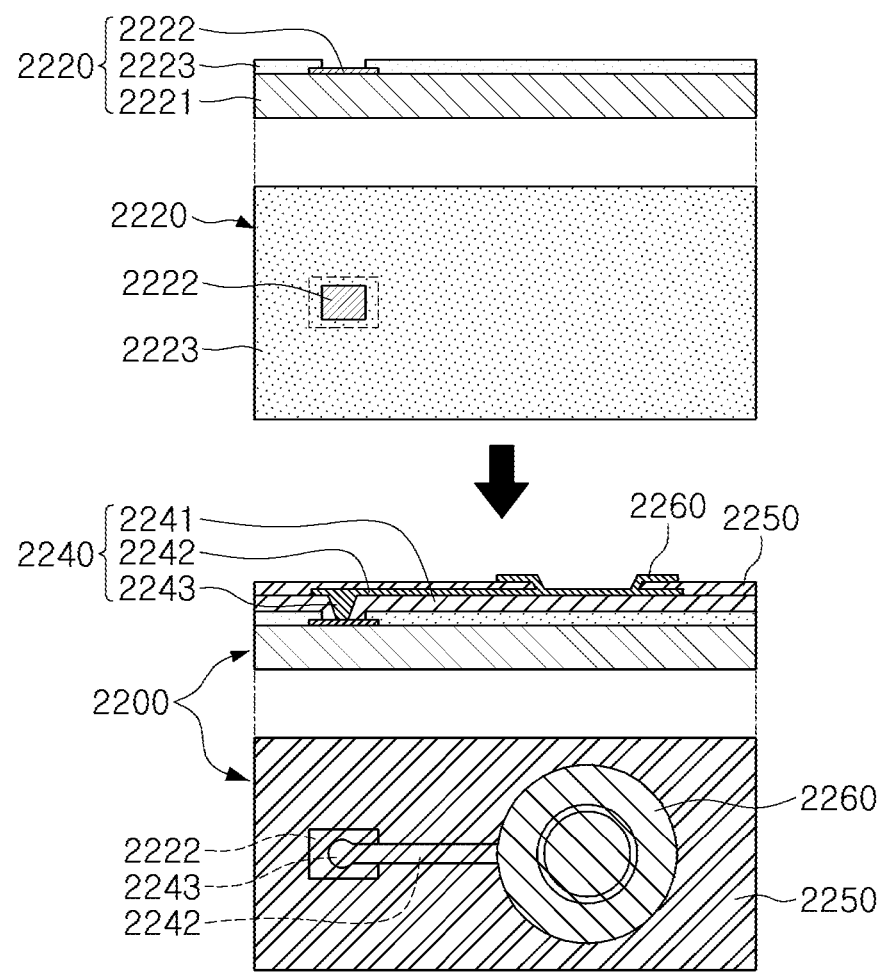
FIGS. 3A and 3B are schematic cross-sectional views illustrating a fan-in semiconductor package before and after being packaged.
Figure 3B:
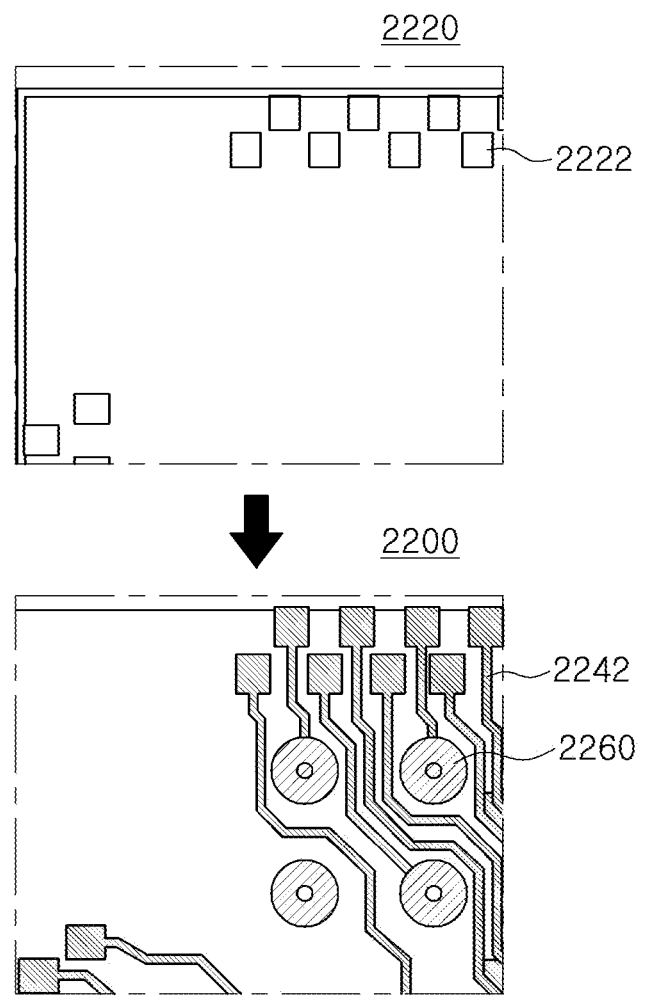

FIGS. 3A and 3B are schematic cross-sectional views illustrating states of a fan-in semiconductor package before and after being packaged.

Figure 4:
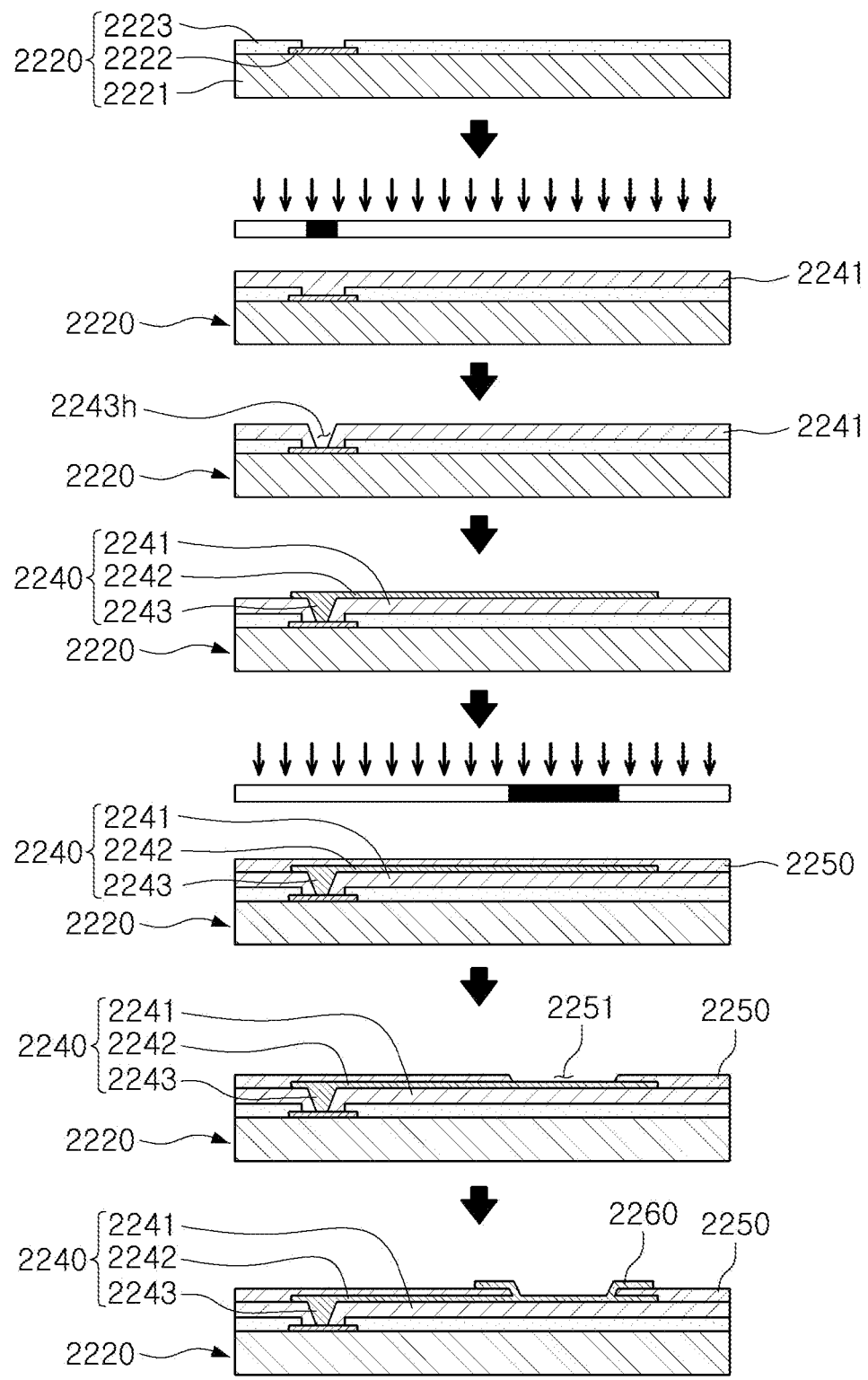
FIG. 4 shows schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a metal material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal 2260, or the like, may be formed. That is, a fan-in semiconductor package 2200 including, for example, the semiconductor chip 2220, the connection structure 2240, the passivation layer 2250, and the underbump metal 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
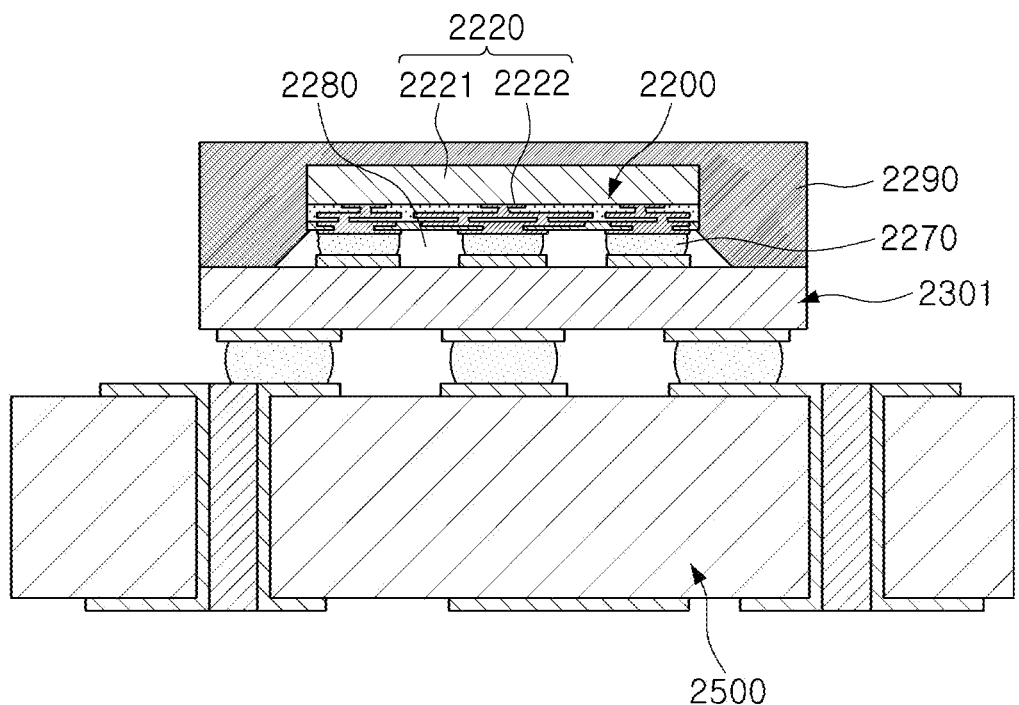
FIG. 5 is a schematic cross-sectional view illustrating a fan-in semiconductor package mounted on a printed circuit substrate and ultimately mounted on a mainboard of an electronic device.

FIG. 5 is a schematic cross-sectional view illustrating a case in which a fan-in semiconductor package is mounted on a printed circuit substrate and is ultimately mounted on a mainboard of an electronic device.

Figure 6:
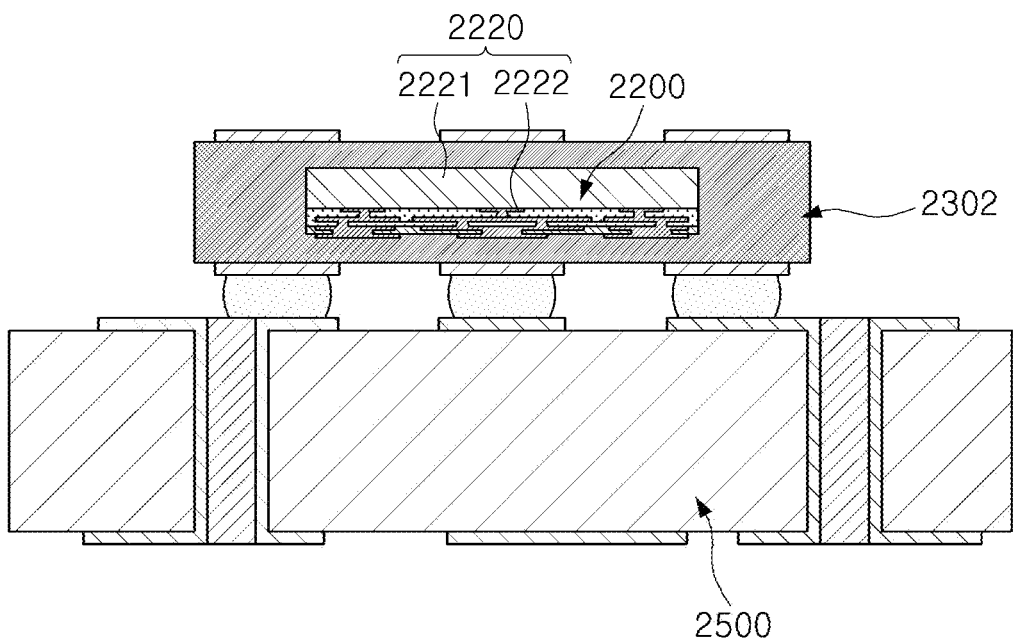
FIG. 6 is a schematic cross-sectional view illustrating a fan-in semiconductor package embedded in a printed circuit board and ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
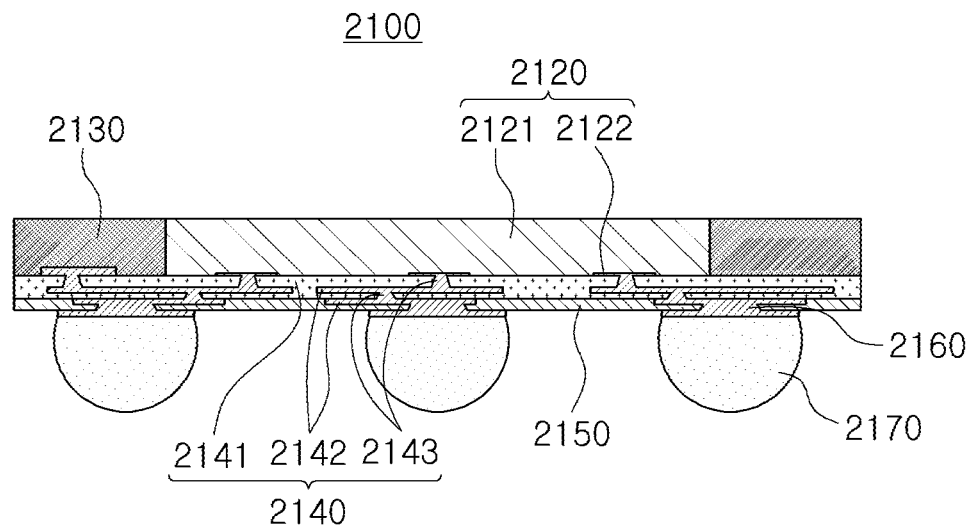
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal 2160 may further be formed in openings of the passivation layer 2150. Solder balls 2170 may further be formed on the underbump metal 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2141, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
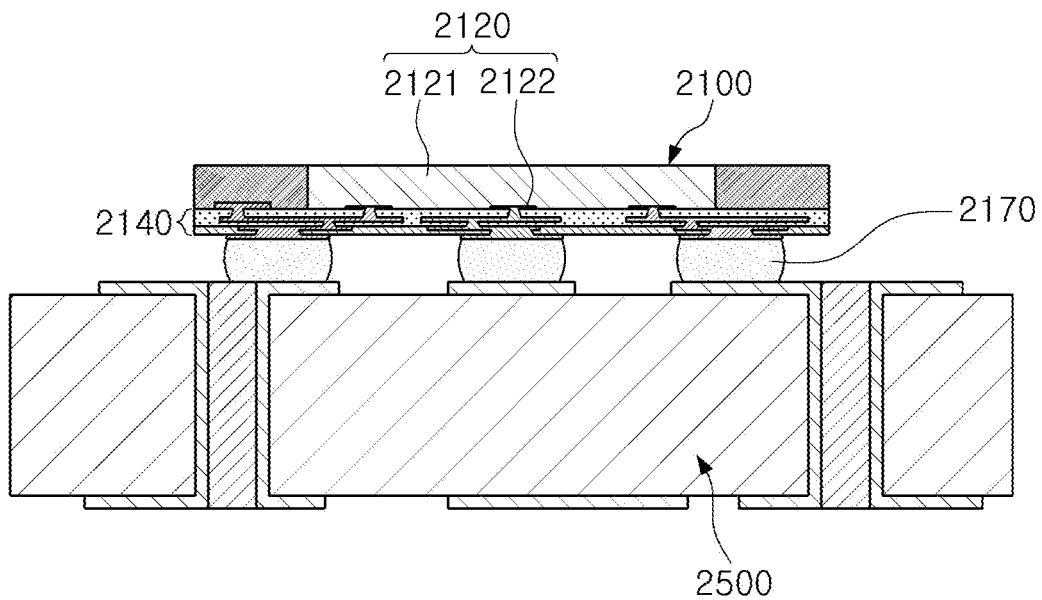
FIG. 8 is a schematic cross-sectional view illustrating a fan-out semiconductor package mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A semiconductor package of which a thickness may be sufficiently reduced and in which electrical performance of a mounted memory package may be improved will hereinafter be described with reference to the drawings.

Figure 9:
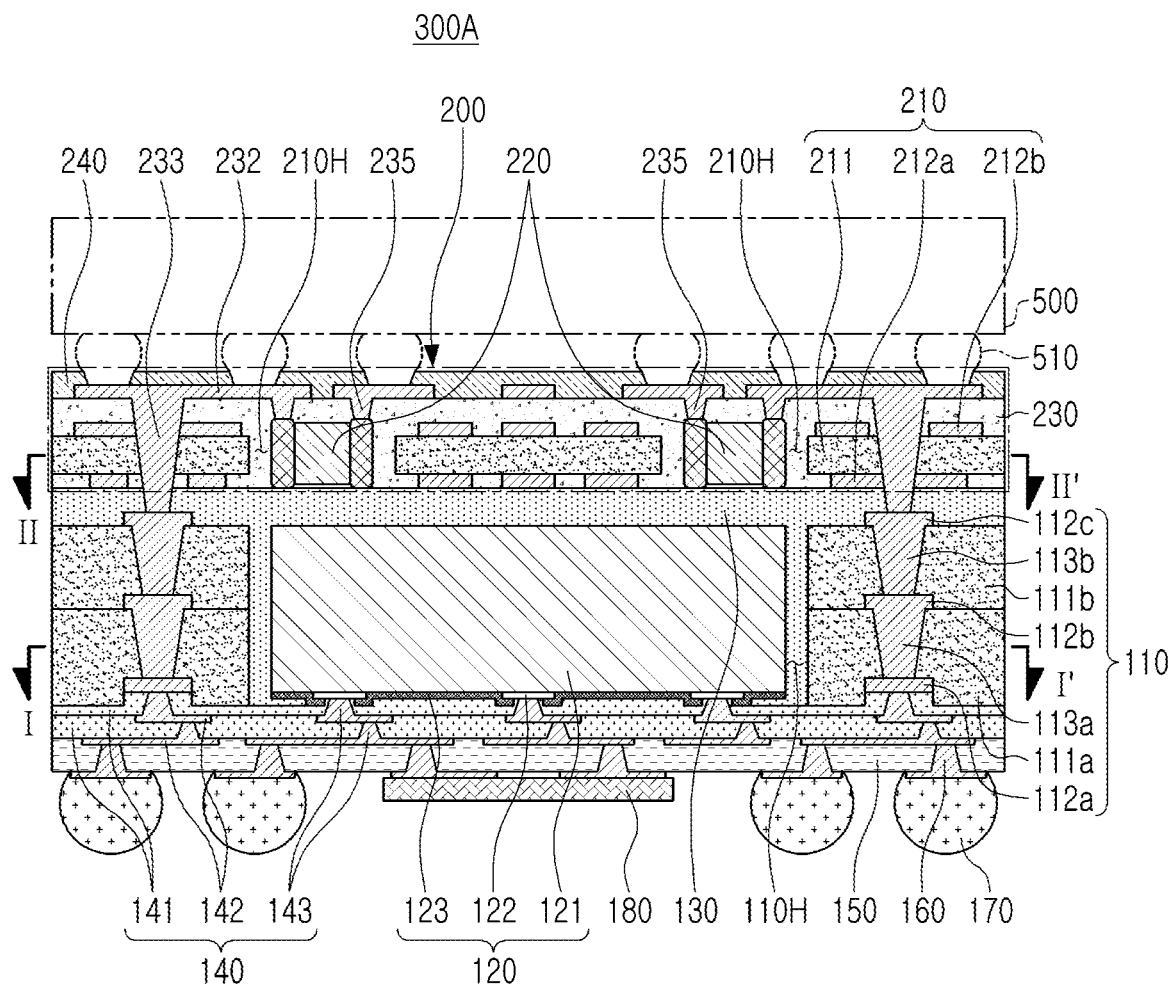
FIG. 9 is a schematic cross-sectional view illustrating a semiconductor package according to an exemplary embodiment in the present disclosure.

FIG. 9 is a schematic cross-sectional view illustrating a semiconductor package according to an exemplary embodiment in the present disclosure.

Figure 10:
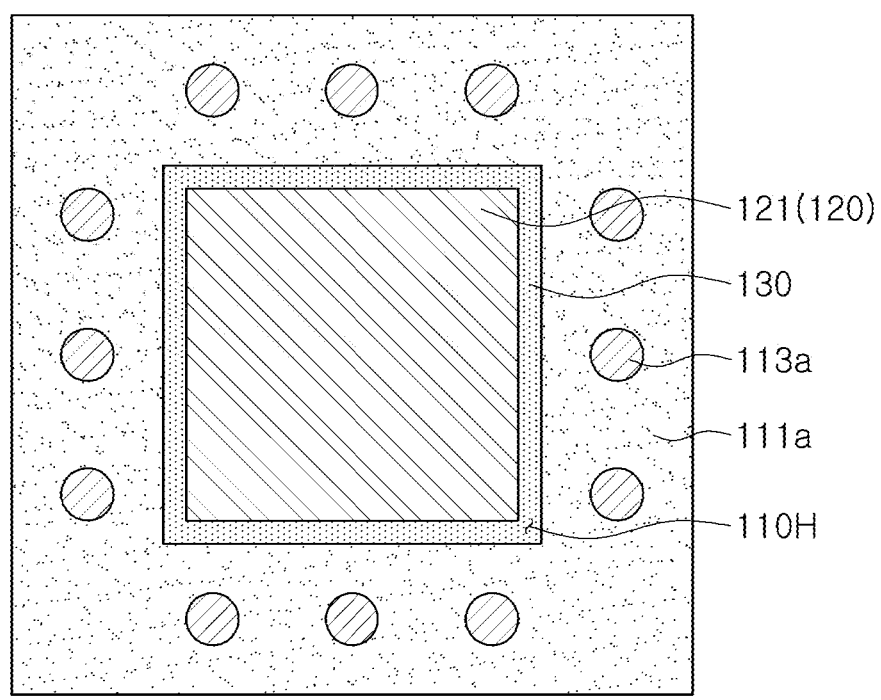
FIG. 10 is a schematic plan view taken along line I-I' of the semiconductor package of FIG. 9.

FIG. 10 is a schematic plan view taken along line I-I' of the semiconductor package of FIG. 9.

Figure 11:
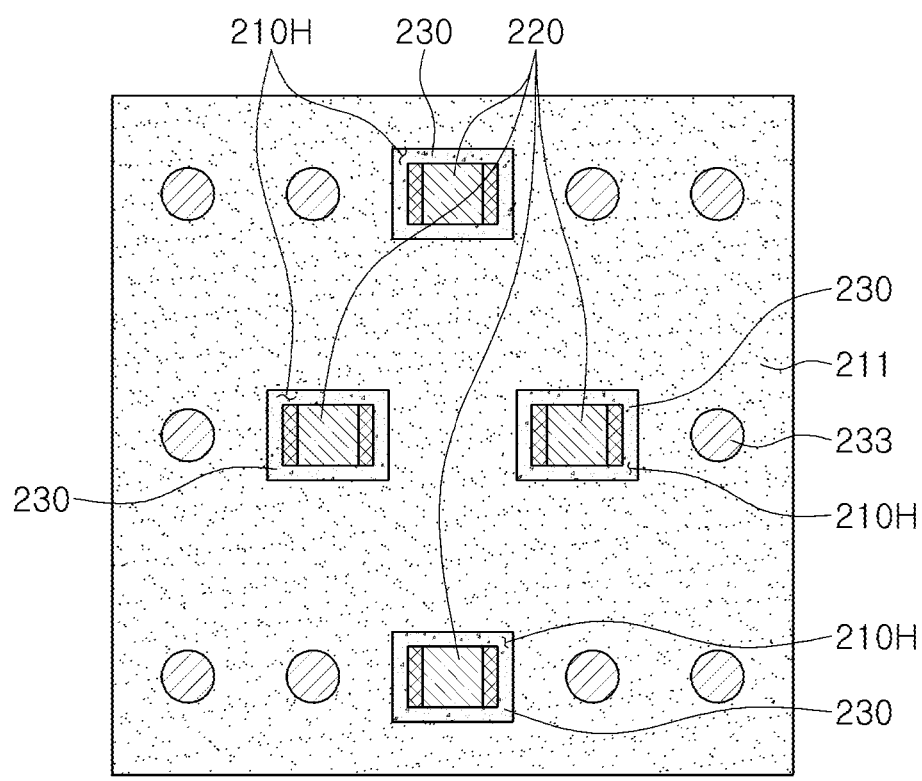
FIG. 11 is a schematic plan view taken along line II-II' of the fan-out semiconductor package of FIG. 9.

FIG. 11 is a schematic plan view taken along line II-II' of the fan-out semiconductor package of FIG. 9.

Referring to FIGS. 9 through 11, a semiconductor package 300A according to the exemplary embodiment may include a first frame 110 having a first through part 110H and including one or more conductor pattern layers 112a, 112b, and 112c, a semiconductor chip 120 disposed in the first through part 110H and having connection pads 122, a first encapsulant 130 covering at least portions of each of the first frame 110 and the semiconductor chip 120, a connection structure 140 disposed on a lower surface of the first frame 110 and the semiconductor chip 120 and including one or more redistribution layers 142 electrically connected to the connection pads 122, a wiring structure 200 disposed on the first encapsulant 130, having passive components 220 embedded therein, and including one or more wiring layers 212a, 212b, and 232 electrically connected to the passive components 220, a passivation layer 150 disposed on a lower surface of the connection structure 140 and having openings exposing at least portions of the redistribution layer 142, underbump metal bumps 160 disposed in the openings of the passivation layer 150 and electrically connected to the exposed redistribution layer 142, electrical connection metals 170 disposed on the underbump metal bumps 160 and electrically connected to the exposed redistribution layer 142, and an electronic component 180 disposed on a lower surface of the passivation layer 150 in a surface mount form. The wiring structure 200 may be disposed to be integrated with the first encapsulant 130, and may be, for example, disposed to be in physical contact with an upper surface of the first encapsulant 130.

Meanwhile, as described above, in order to cope with slimness of mobile devices and the trends of development of the mobile devices, technology of reducing a height of a mobile dynamic random access memory (DRAM) package interworking with an application processor (AP) has been continuously developed. For example, thicknesses of a die, a die attach film, a printed circuit board, a wire bonding, a molding, and the like, related to the height have been gradually reduced to reduce the height of the mobile DRAM package. However, related technology is expected to reach a limitation before long in reducing the height of the mobile DRAM package. For example, in a case of the printed circuit board, a limitation related to the thickness is apparent, and thus, there is a demand for preparation for a new structure to be used as redistribution patterns of a semiconductor. Meanwhile, performance of a memory has improved and a driving voltage of the memory has been reduced, such that it has been considered to use a decoupling capacitor in order to stabilize the driving voltage.

On the other hand, in the semiconductor package 300A according to the exemplary embodiment, the passive components 220 may be embedded on the first encapsulant 130, and the wiring structure 200 including one or more wiring layers 212a, 212b, and 232 may be disposed to be integrated with the first encapsulant 130. In this case, the passive components 220 may be used as decoupling capacitors. Therefore, when a separate memory package 500 is disposed on the semiconductor package 300A according to the exemplary embodiment in a package-on-package (POP) form, performance of the memory package 500 mounted through the wiring structure 200 may be improved. For example, a driving voltage may be stabilized, and signal transmission loss may be reduced. Nevertheless, since the wiring structure 200 includes one or more wiring layers 212a, 212b, and 232, a design of a printed circuit board of the memory package 500 may be simplified, such that a thickness of the memory package 500 mounted on the semiconductor package 300A may also be reduced. In addition, since the wiring structure 200 is disposed to be integrated with the first encapsulant 130, a thickness of the semiconductor package 300A itself according to the exemplary embodiment may also be reduced.

Meanwhile, the memory package 500 may have a form in which a plurality of memory chips are stacked, are disposed on the printed circuit board, are connected to each other by wires, and/or are then molded with a molding material, but is not limited thereto. The memory package 500 may be mounted in the POP form through solder balls 510, or the like, connected to an exposed backside wiring layer 232.

Meanwhile, the wiring structure 200 may include a second frame 210 disposed on the first encapsulant 130, having second through parts 210H, and including one or more core wiring layers 212a and 212b, the passive components 220 disposed in the second through parts 210H, a second encapsulant 230 covering at least portions of each of the second frame 210 and the passive components 220, a backside wiring layer 232 disposed on the second encapsulant 230, first wiring vias 233 electrically connecting the backside wiring layer 232 and the uppermost conductor pattern layer 112c to each other, and second wiring vias 235 electrically connecting the backside wiring layer 232 and the passive components 220 to each other. The wiring layers 212a, 212b, and 232 described above may include the core wiring layers 212a and 212b and the backside wiring layer 232.

When the second frame 210 having the second through parts 210H and including one or more core wiring layers 212a and 212b is introduced and the passive components 220 are disposed in the second through parts 210H of the second frame 210, as described above, a more compact design may be possible. The number of second through parts 210H may be plural, and the same or different passive components 220 may be disposed in the second through parts 210, respectively. In this case, performance may further be improved with a compact design.

Meanwhile, the first wiring vias 233 may penetrate through the second encapsulant 230, the second frame 210, and the first encapsulant 130 and electrically connect the backside wring layer 232 and the uppermost conductor pattern layer 112c of the first frame 110 to each other. The second wiring vias 235 may penetrate through the second encapsulant 230 and electrically connect the backside wiring layer 232 and the respective passive components 220 to each other. Resultantly, the respective passive components 220 may be electrically connected to the connection pads 122 of the semiconductor chip 120 through these paths. Meanwhile, a height of the first wiring via 233 may be greater than that of the second wiring via 235.

Meanwhile, the first wiring vias 233 may penetrate through at least portions of the core wiring layers 212a and 212b, and the first wiring vias 233 and the core wiring layers 212a and 212b may be in contact with each other in these penetration regions to be electrically connected to each other. That is, the first wiring vias 233 are not formed for each layer together with separate pad patterns, and may be formed at a time from the backside wiring layer 232 to the uppermost conductor pattern layer 112c so as to connect backside wiring layer 232 and the uppermost conductor pattern layer 112c to each other. In this case, electrical connection between the first wiring vias 233 and the core wiring layers 212a and 212b may be made in a doughnut form in the penetration regions. Therefore, a process may be simplified, and electrical connection may be promoted.

Meanwhile, the wiring structure 200 may further include a cover layer 240 disposed on the second encapsulant 230 and having openings exposing at least portions of the backside wiring layer 232. The backside wiring layer 232 may be protected through the cover layer 240.

The respective components of the semiconductor package 300A will hereinafter be described in more detail with reference with reference to the drawings.

The first frame 110 may further improve rigidity of the semiconductor package 300A depending on certain materials of insulating layers 111a and 111b, and serve to secure uniformity of a thickness of the first encapsulant 130. The first frame 110 may have the first through part 110H penetrating through the insulating layers 111a and 111b. The semiconductor chip 120 may be disposed in the first through part 110H, and one or more passive component(s) (not illustrated) may optionally be disposed together with the semiconductor chip 120 in the first through part 110H. The first through part 110H may have a form in which walls thereof surround the semiconductor chip 120, but is not necessarily limited thereto. The first frame 110 may include the conductor pattern layers 112a, 112b, and 112c and conductor vias 113a and 113b, in addition to the insulating layers 111a and 111b, and may thus function as an electrical connection member providing a vertical electrical connection path. An electrical connection member that may provide another type of vertical electrical connection path such as a metal post may be optionally introduced as the first frame 110.

The first frame 110 may include a first insulating layer 111a, a first conductor pattern layer 112a in contact with the connection structure 140 and embedded in the first insulating layer 111a, a second conductor pattern layer 112b disposed on the other surface of the first insulating layer 111a opposing one surface of the first insulating layer 111a in which the first conductor pattern layer 112a is embedded, a second insulating layer 111b disposed on the other surface of the first insulating layer 111a opposing the one surface of the first insulating layer 111a in which the first conductor pattern layer 112a is embedded and covering at least portions of the second conductor pattern layer 112b, and a third conductor pattern layer 112c disposed on the other surface of the second insulating layer 111b opposing one surface of the second insulating layer 111b in which the second conductor pattern layer 112b is embedded. The first and second conductor pattern layers 112a and 112b and the second and third conductor pattern layers 112b and 112c may respectively be electrically connected to each other through first and second conductor vias 113a and 113b penetrating through the first and second insulating layers 111a and 111b, respectively. The first to third conductor pattern layers 112a, 112b, and 112c may be electrically connected to the connection pads 122 depending on functions through the redistribution layers 142 and connection vias 143 of the connection structure 140.

A material of each of the insulating layers 111a and 111b is not particularly limited. For example, an insulating material may be used as the material of each of the insulating layers 111a and 111b. In this case, a thermosetting resin such as an epoxy resin, a thermoplastic resin such as a polyimide resin, a resin in which the thermosetting resin and the thermoplastic resin are mixed with an inorganic filler, for example, Ajinomoto Build-up Film (ABF), or the like, may be used as the insulating material. Alternatively, a material in which the resin described above is impregnated together with an inorganic filler in a core material such as a glass fiber (or a glass cloth or a glass fabric), for example, prepreg, or the like, may also be used as the insulating material.

The conductor pattern layers 112a, 112b, and 112c may provide vertical electrical connection paths of the semiconductor package together with the conductor vias 113a and 113b, and may serve to redistribute the connection pads 122. A material of each of the conductor pattern layers 112a, 112b, and 112c may be a metal material such as copper (Cu), aluminum (Al), silver (Ag), tin (Sn), gold (Au), nickel (Ni), lead (Pb), titanium (Ti), or alloys thereof. The conductor pattern layers 112a, 112b, and 112c may perform various functions depending on designs of corresponding layers. For example, the conductor pattern layers 122 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. The ground (GND) pattern and the power (PWR) pattern may be the same pattern. In addition, the conductor pattern layers 112a, 112b, and 112c may be various kinds of via pads, or the like, respectively. Each of the conductor pattern layers 112a, 112b, and 112c may be formed by a plating process, and may include a seed layer and a plating layer.

A thickness of each of the conductor pattern layers 112a, 112b, and 112c may be greater than that of each of the redistribution layers 142. In detail, the first frame 110 may have a thickness equal to or greater than that of the semiconductor chip 120, and prepreg, or the like, may be selected as a material of each of the insulating layers 111a and 111b in order to maintain the rigidity of the semiconductor package. Therefore, the thicknesses of the formed conductor pattern layers 112a, 112b, and 112c may be relatively great. On the other hand, the connection structure 140 may provide a fine circuit and a high density design. Therefore, a PID, or the like, may be selected as a material of each of the insulating layers 141, and a thickness of each of the redistribution layers 142 may thus be relatively small.

The first conductor pattern layer 112a may be recessed into the first insulating layer 111a. As described above, in a case in which the first conductor pattern layer 112a is recessed into the first insulating layer 111a, such that a surface of the first insulating layer 111a in contact with the connection structure 140 and a surface of the first conductor pattern layer 112a in contact with the connection structure 140 have a step therebetween, when the semiconductor chip 120 and the first frame 110 are encapsulated with the first encapsulant 130, a phenomenon in which a material of the first encapsulant 130 bleeds to pollute the first conductor pattern layer 112a may be prevented.

The conductor vias 113a and 113b may electrically connect the conductor pattern layers 112a, 112b, and 112c formed on different layers to each other, resulting in an electrical path in the first frame 110. A material of each of the conductor vias 113a and 113b may be a metal material such as copper (Cu), aluminum (Al), silver (Ag), tin (Sn), gold (Au), nickel (Ni), lead (Pb), titanium (Ti), or alloys thereof. The conductor vias 113a and 113b may include signal vias, power vias, ground vias, and the like, and the power vias and the ground vias may be the same as each other. Each of the conductor vias 113a and 113b may be a filled-type via filled with the metal material, or be a conformal-type via in which the metal material may be formed along a wall of each of via holes. In addition, each of the conductor vias 113a and 113b may have a tapered shape. Each of the conductor vias 113a and 113b may be formed by a plating process, and may include a seed layer and a conductor layer.

When holes for the first conductor vias 113a are formed, some of the pads of the first conductor pattern layer 112a may serve as a stopper, and it may thus be advantageous in a process that each of the first conductor vias 113a has a tapered shape of which a width of an upper surface is greater than that of a lower surface. In this case, the first conductor vias 113a may be integrated with pad patterns of the second conductor pattern layer 112b. In addition, when holes for the second conductor vias 113b are formed, some of the pads of the second conductor pattern layer 112b may serve as a stopper, and it may thus be advantageous in a process that each of the second conductor vias 113b has a tapered shape of which a width of an upper surface is greater than that of a lower surface. In this case, the second conductor vias 113b may be integrated with pad patterns of the third conductor pattern layer 112c.

Meanwhile, although not illustrated in the drawings, a metal layer (not illustrated) may be disposed on the walls of the first through part 110H of the first frame 110 in order to block electromagnetic waves or dissipate heat. The metal layer (not illustrated) may surround the semiconductor chip 120, and may be disposed on walls of the first frame 110 (e.g., walls of the first and second insulating layers 111a and 111b) facing the first through part 110H.

The semiconductor chip 120 may be an integrated circuit (IC) providing in an amount of several hundred to several million or more elements integrated in a single chip. In this case, the IC constituting the semiconductor chip 120 may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be an integrated circuit in a bare state in which separate bumps or redistribution layers are not formed. However, the semiconductor chip 120 is not limited thereto, and may be a packaged-type IC.

The integrated circuit may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a metal material such as copper (Cu), aluminum (Al), or the like. A passivation layer 123 having openings exposing the connection pads 122 may be formed on the body 121, and may be an oxide layer, a nitride layer, or the like, or a double layer of an oxide layer and a nitride layer. An insulating layer (not illustrated), and the like, may further be disposed in other appropriate positions. Meanwhile, an active surface of the semiconductor chip 120 refers to a surface of the semiconductor chip 120 on which the connection pads 122 are disposed, and an inactive surface of the semiconductor chip 120 refers to a back surface of the semiconductor chip 120 opposing the active surface. However, in some cases, both of the opposing surfaces of the semiconductor chip 120 may be active surfaces by disposing connection pads on the back surface of the semiconductor chip. Meanwhile, in the exemplary embodiment, when the passivation layer 123 is formed on the active surface of the semiconductor chip 120, a position relationship of the active surface of the semiconductor chip 120 may be determined on the basis of the lowermost surface of the passivation layer 123.

The first encapsulant 130 may cover at least portions of the semiconductor chip 120 and the first frame 110, and fill at least portions of the first through part 110H. The first encapsulant 130 may include an insulating material. In this case, the insulating material may be a non-PID, more specifically, a non-PID including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, Bismaleimide Triazine (BT), or the like. Alternatively, a material in which an insulating resin such as a thermosetting resin or a thermoplastic resin is impregnated in an inorganic filler and/or a core material such as a glass fabric may also be used as the insulating material. Therefore, void and undulation problems may be suppressed, and warpage of the semiconductor package may be more easily controlled. Alternatively, a photoimageable encapsulant (PIE) may be used as the insulating material.

The connection structure 140 may redistribute the connection pads 122 of the semiconductor chip 120. Several tens to several hundreds of connection pads 122 of the semiconductor chip 120 having various functions may be redistributed by the connection structure 140, and may be physically or electrically externally connected through the electrical connection metals 170 depending on functions. The connection structure 140 may include the insulating layers 141, the redistribution layers 142 disposed on lower surfaces of the insulating layers 141, and the connection vias 143 penetrating through the insulating layers 141 and connected to the redistribution layers 142. The numbers of insulating layers 141, redistribution layers 142, and connection vias 143 may be more than those illustrated in the drawings or be less than those illustrated in the drawings. That is, the number of layers may be changed depending on a design.

A material of each of the insulating layers 141 may be an insulating material. Here, the insulating material may be a PID. In this case, a fine pitch may be introduced through a photo-via, which is advantageous for a fine circuit and a high density design, such that several tens to several millions of connection pads 122 of the semiconductor chip 120 may be very effectively redistributed. A boundary between the insulating layers 141 may be apparent or may not be apparent.

The redistribution layers 142 may redistribute the connection pads 122 of the semiconductor chip 120 to electrically connect the connection pads 122 of the semiconductor chip 120 to the electrical connection metals 170. A material of each of the redistribution layers 142 may be a metal material such as copper (Cu), aluminum (Al), silver (Ag), tin (Sn), gold (Au), nickel (Ni), lead (Pb), titanium (Ti), or alloys thereof. The redistribution layers 142 may perform various functions depending on their designs. For example, the redistribution layers 142 may include ground (GND) patterns, power (PWR) patterns, signal (S) patterns, and the like. The ground (GND) pattern and the power (PWR) pattern may be the same pattern. In addition, the redistribution layers 142 may include various kinds of via pads, electrical connection metal pads, or the like. Each of the redistribution layers 142 may be formed by a plating process, and may include a seed layer and a conductor layer.

The connection vias 143 may electrically connect the redistribution layers 142 formed on different layers to each other. In addition, the connection vias 143 may electrically connect the connection pads 122 of the semiconductor chip 120 and the first conductor pattern layer 112a of the first frame 110 to the redistribution layer 142. The connection vias 143 may be in physical contact with the connection pads 122 when the semiconductor chip 120 is a bare die. A material of each of the connection vias 143 may be a metal material such as copper (Cu), aluminum (Al), silver (Ag), tin (Sn), gold (Au), nickel (Ni), lead (Pb), titanium (Ti), or alloys thereof. The connection vias 143 may include signal vias, power vias, ground vias, and the like, and the power vias and the ground vias may be the same as each other. Each of the connection vias 143 may be a filled-type via filled with the metal material, or be a conformal-type via in which the metal material may be formed along a wall of each of via holes. In addition, each of the connection vias 143 may have a tapered shape of which a direction is opposite to that of each of the conductor vias 113a and 113b. Each of the connection vias 143 may be formed by a plating process, and may include a seed layer and a conductor layer.

The passivation layer 150 may be additionally configured to protect the connection structure 140 from external physical or chemical damage. The passivation layer 150 may include a thermosetting resin. For example, the passivation layer 150 may be formed of ABF, but is not limited thereto. The passivation layer 150 may have openings exposing at least portions of the lowermost redistribution layer 142 of the redistribution layers 142. The openings may be provided in an amount of several tens to several tens of thousands or may be provided in an amount of several tens to several tens of thousands or more or several tens to several tens of thousands or less. Each opening may include a plurality of holes. A surface mount component (e.g., 180) such as a capacitor may be disposed on the lower surface of the passivation layer 150 and be electrically connected to the redistribution layer 142. Resultantly, the surface mount component may be electrically connected to the semiconductor chip 120.

The underbump metal bumps 160 may be additionally configured to improve connection reliability of the electrical connection metals 170, resulting in improvement of board level reliability of the semiconductor package 300A. The underbump metal bumps 160 may be provided in an amount of several tens to several millions or may be provided in an amount of several tens to several millions or more or several tens to several millions or less. The underbump metal bumps 160 may be formed in the openings of the passivation layer 150, and may be electrically connected to the opened/exposed lowermost redistribution layer 142. The underbump metal bumps 160 may be formed by a metallization method using a metal, but are not limited thereto.

The electrical connection metals 170 may be additionally configured to physically or electrically externally connect the semiconductor package 300A. For example, the semiconductor package 300A may be mounted on the mainboard of the electronic device through the electrical connection metals 170. The electrical connection metals 170 may be disposed on the lower surface of the passivation layer 150, and may be electrically connected to the underbump metal bumps 160, respectively. Each of the electrical connection metals 170 may be formed of a low melting point metal such as tin (Sn) or alloys including tin (Sn). In more detail, each of the electrical connection metals 170 may be formed of a solder, or the like. However, this is only an example, and a material of each of the electrical connection metals 170 is not particularly limited thereto.

Each of the electrical connection metals 170 may be a land, a ball, a pin, or the like. The electrical connection metals 170 may be formed as a multilayer or single layer structure. When the electrical connection metals 170 are formed as a multilayer structure, the electrical connection metals 170 may include a copper (Cu) pillar and a solder. When the electrical connection metals 170 are formed as a single layer structure, the electrical connection metals 170 may include a tin-silver solder or copper (Cu). However, this is only an example, and the electrical connection metals 170 are not limited thereto. The number, an interval, a disposition form, and the like, of electrical connection metals 170 are not particularly limited, but may be sufficiently modified depending on design particulars by those skilled in the art. For example, the electrical connection metals 170 may be provided in an amount of several tens to several millions according to the number of connection pads 122, or may be provided in an amount more than several tens to several millions or less than several tens to several millions.

At least one of the electrical connection metals 170 may be disposed in a fan-out region. The fan-out region refers to a region except for (or outside of) a region in which the semiconductor chip 120 is disposed (e.g., outside of a region overlapping with the semiconductor chip 120 in a stacking direction of the semiconductor chip 120 on the connection structure 140). The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The electronic component 180 may be additionally configured to be disposed on the lower surface of the passivation layer 150 in the surface mount form and may be electrically connected to the exposed redistribution layer 142. The electronic component 180 may be a passive component such as a land side capacitor (LSC) or may be an integrated passive device (IPD). Alternatively, the electronic component 180 may be an integrated circuit die.

The second frame 210 may additionally improve rigidity of the semiconductor package 300A above the semiconductor package 300A depending on certain materials of a core layer 211, and serve to secure uniformity of a thickness of the second encapsulant 230. The second frame 210 may have the second through parts 210H penetrating through the core layer 211. The number of second through parts 210H may be plural. The passive components 220 may be disposed in the second through parts 210H, respectively. The respective second through parts 210H may surround the passive components 220, but are not necessarily limited thereto. The second frame 210 may include the core layer 211 and the core wiring layers 212a and 212b disposed, respectively, on opposite surfaces of the core layer 211. The passive components 220 may be compactly disposed through the second frame 210, and circuits may be variously designed on a backside of the semiconductor package.

A material of the core layer 211 is not particularly limited. For example, an insulating material may be used as the material of the core layer 211. In this case, a thermosetting resin such as an epoxy resin, a thermoplastic resin such as a polyimide resin, a resin in which the thermosetting resin and the thermoplastic resin are mixed with an inorganic filler, for example, ABF, or the like, may be used as the insulating material. Alternatively, a material in which the resin described above is impregnated together with an inorganic filler in a core material such as a glass fiber (or a glass cloth or a glass fabric), for example, prepreg, or the like, may also be used as the insulating material.

The core wiring layers 212a and 212b may enable a wiring design on the backside of the semiconductor package 300A. A material of each of the core wiring layers 212a and 212b may be a metal material such as copper (Cu), aluminum (Al), silver (Ag), tin (Sn), gold (Au), nickel (Ni), lead (Pb), titanium (Ti), or alloys thereof. The core wiring layers 212a and 212b may perform various functions depending on designs of corresponding layers. For example, the core wiring layers 212a and 212b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. The ground (GND) pattern and the power (PWR) pattern may be the same pattern. Each of the core wiring layers 212a and 212b may be formed by a plating process, and may include a seed layer and a plating layer.

Each of the passive components 220 may be a chip-type component. Here, the chip-type component refers to, for example, a separate chip-type component in which an internal electrode is formed in a body and an external electrode electrically connected to the internal electrode is formed on an outer surface of the body. The passive component 220 may be a passive component such as a capacitor, an inductor, a bead, or the like. For example, the passive component 220 may be a decoupling capacitor. A specific example of the passive component 220 may include a capacitor such as a multilayer ceramic capacitor (MLCC), a low inductance chip capacitor (LICC), an inductor such as a power inductor, or the like, but is not limited thereto.

The second encapsulant 230 may cover at least portions of each of the passive components 220 and the second frame 210, and fill at least portions of each of the second through parts 210H. The second encapsulant 230 may include an insulating material. In this case, the insulating material may be a non-PID, more specifically, a non-PID including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like. Alternatively, a material in which an insulating resin such as a thermosetting resin or a thermoplastic resin is impregnated in an inorganic filler and/or a core material such as a glass fabric may also be used as the insulating material. Therefore, void and undulation problems may be suppressed, and warpage of the semiconductor package may be more easily controlled. Alternatively, a PIE may be used as the insulating material.

The backside wiring layer 232 may be disposed on the second encapsulant 230 and provide a conductive backside circuit to the wiring structure 200. The backside wiring layer 232 may include a metal material such as copper (Cu), aluminum (Al), silver (Ag), tin (Sn), gold (Au), nickel (Ni), lead (Pb), titanium (Ti), or alloys thereof. The backside wiring layer 232 may perform various functions depending on a design. For example, the backside wiring layer 232 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. The ground (GND) pattern and the power (PWR) pattern may be the same pattern. The backside wiring layer 232 may be formed by a plating process, and may include a seed layer and a conductor layer.

The first wiring vias 233 may penetrate through the second encapsulant 230, the second frame 210, and the first encapsulant 130 and electrically connect the backside wring layer 232 to the third conductor pattern layer 112c, e.g. the uppermost conductor pattern layer of the first frame 110. Each of the first wiring vias 233 may include a metal material such as copper (Cu), aluminum (Al), silver (Ag), tin (Sn), gold (Au), nickel (Ni), lead (Pb), titanium (Ti), or alloys thereof. Each of the first wiring vias 233 may be a filled-type via filled with the metal material, or be a conformal-type via in which the metal material may be formed along a wall of each of via holes. In addition, each of the first wiring vias 233 may have a tapered shape of which a direction is the same as that of each of the conductor vias 113a and 113b (e.g., a tapered shape in which a narrow end of a first wiring via 233 contacts the third conductor pattern layer 112c). The first wiring vias 233 may include signal vias, ground vias, power vias, and the like, and the power vias and the ground vias may be the same as each other. Each of the first wiring vias 233 may be formed by a plating process, and may include a seed layer and a conductor layer. The first wiring vias 233 may be formed together with the backside wiring layer 232 by plating at the time of forming the backside wiring layer 232, and the first wiring vias 233 and the backside wiring layer 232 may thus be integrated with each other without having a boundary therebetween.

The second wiring vias 235 may penetrate through the second encapsulant 230 and electrically connect the backside wiring layer 232 to the external electrodes of the respective passive components 220. Each of the second wiring vias 235 may include a metal material such as copper (Cu), aluminum (Al), silver (Ag), tin (Sn), gold (Au), nickel (Ni), lead (Pb), titanium (Ti), or alloys thereof. Each of the second wiring vias 235 may be a filled-type via filled with the metal material, or be a conformal-type via in which the metal material may be formed along a wall of each of via holes. In addition, each of the second wiring vias 235 may have a tapered shape of which a direction is the same as that of each of the conductor vias 113a and 113b (e.g., a tapered shape in which a narrow end of a second wiring via 235 contacts the external electrode of a respective passive component 220). The second wiring vias 235 may include signal vias, ground vias, power vias, and the like, and the power vias and the ground vias may be the same as each other. Each of the second wiring vias 235 may be formed by a plating process, and may include a seed layer and a conductor layer. The second wiring vias 235 may be formed together with the backside wiring layer 232 by plating at the time of forming the backside wiring layer 232, and the second wiring vias 235 and the backside wiring layer 232 may thus be integrated with each other without having a boundary therebetween.

The cover layer 240 may be additionally configured to protect the backside wiring layer 232 from external physical or chemical damage. The cover layer 240 may include a thermosetting resin. For example, the cover layer 240 may be formed of ABF, but is not limited thereto. The cover layer 240 may have the openings exposing at least portions of the backside wiring layer 232. The openings may be provided in an amount of several tens to several tens of thousands or may be provided in an amount of several tens to several tens of thousands or more or several tens to several tens of thousands or less. Each opening may include a plurality of holes.

FIGS. 12 through 15 are schematic views illustrating an example of a process of manufacturing the semiconductor package of FIG. 9.

Figure 12:
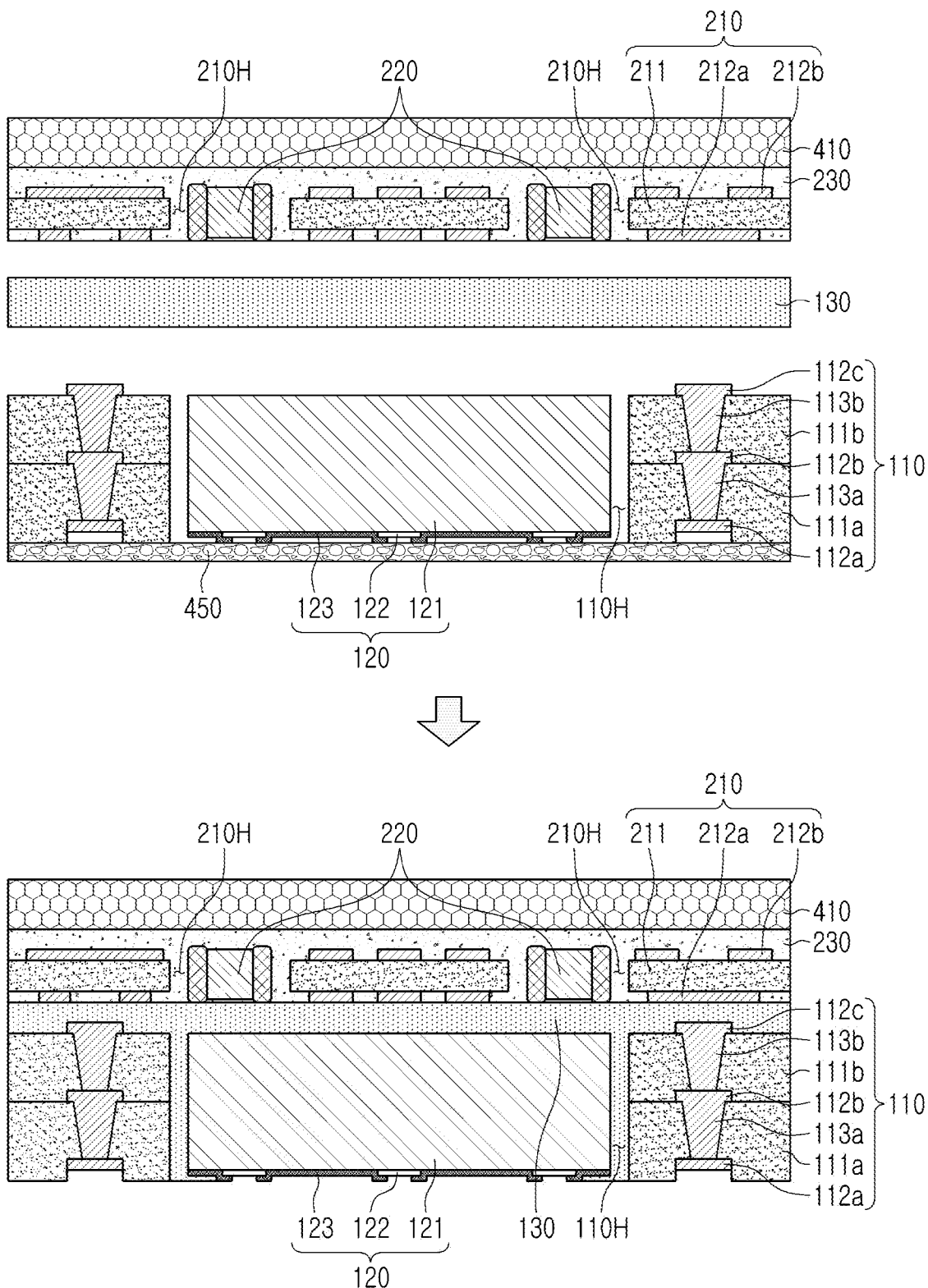
FIGS. 12 through 15 are schematic views illustrating examples of processes for manufacturing the semiconductor package of FIG. 9.

First, referring to FIG. 12, the second frame 210 may be prepared using a copper clad laminate (CCL), or the like. Then, the second through parts 210H may be formed in the second frame 210 using a laser drill, or the like. Then, the passive components 220 may be disposed in the second through parts 210H, and the second frame 210 and the passive components 220 may be covered with the second encapsulant 230. Then, a first carrier 410 may be attached to the second encapsulant 230. In addition, the first through part 110H may be formed in the first frame 110 prepared by a coreless process, or the like, and the semiconductor chip 120 may be disposed in the first through part 110H using a tape 450. Then, the first frame 110 and the semiconductor chip 120 may be covered with the first encapsulant 130. In this case, the first carrier 410 may laminate the second frame 210, the passive components 220, and the second encapsulant 230 described above to allow the second frame 210, the passive components 220, and the second encapsulant 230 described above to be disposed on the first encapsulant 130. In this case, the tape 450 may be removed.

Figure 13:
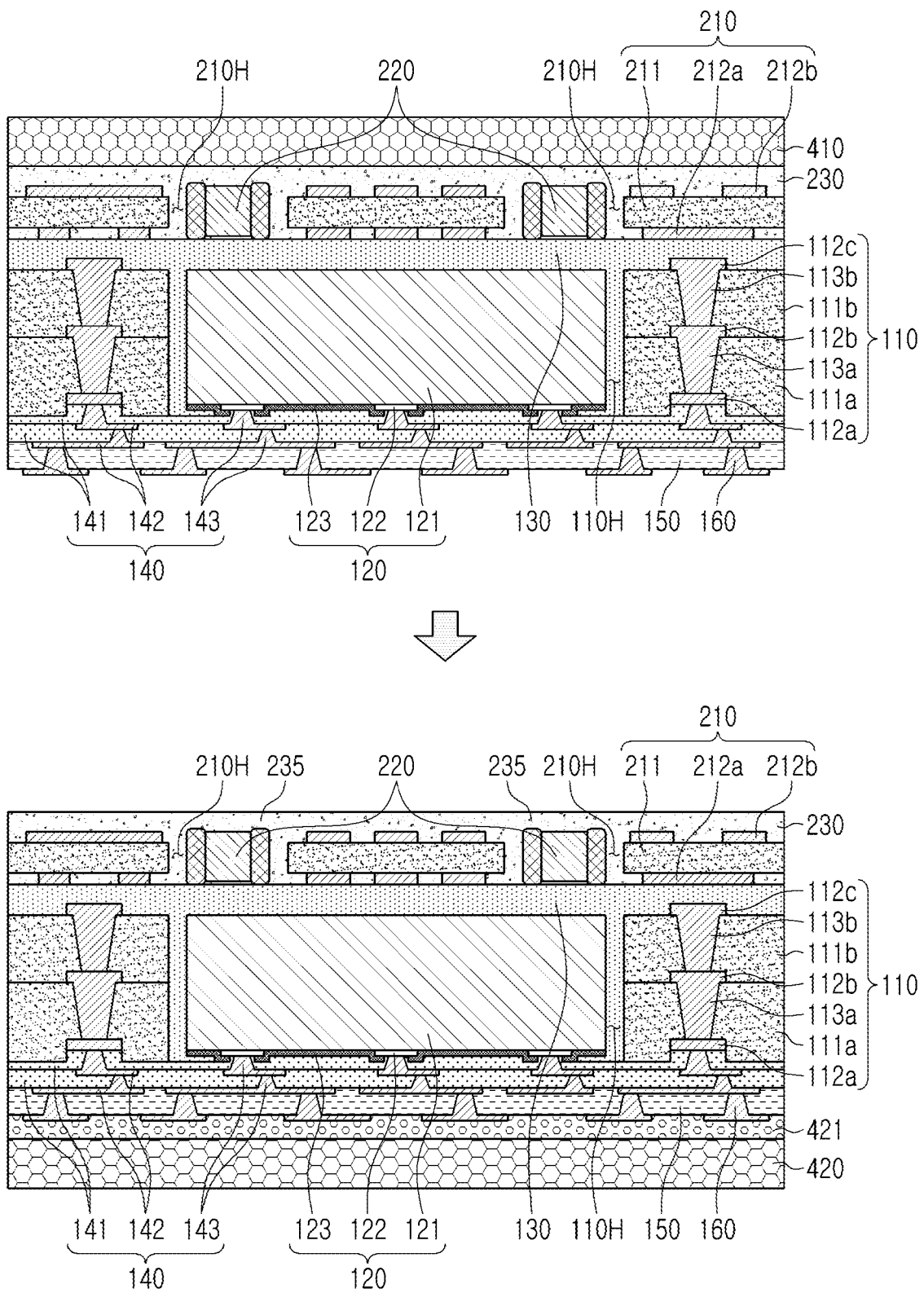

Then, referring to FIG. 13, the connection structure 140, the passivation layer 150, and the underbump metal bumps 160 may be sequentially formed on a region from which the tape 450 is removed. The connection structure 140 may be formed by repeating a process of forming the insulating layer 141 using a PID, forming via holes by a photolithography method, and forming the redistribution layer 142 and the connection vias 143 by plating. In addition, the passivation layer 150 may be formed by stacking and then hardening an ABF, or the like. In addition, the underbump metal bumps 160 may be formed by a plating process. Then, a second carrier 420 on which an insulating layer 421 is formed may be attached to the underbump metal bumps 160. In this case, at least portions of the underbump metal bumps 160 may be embedded in the insulating layer 421. At the same time, the first carrier 410 may be removed.

Figure 14:
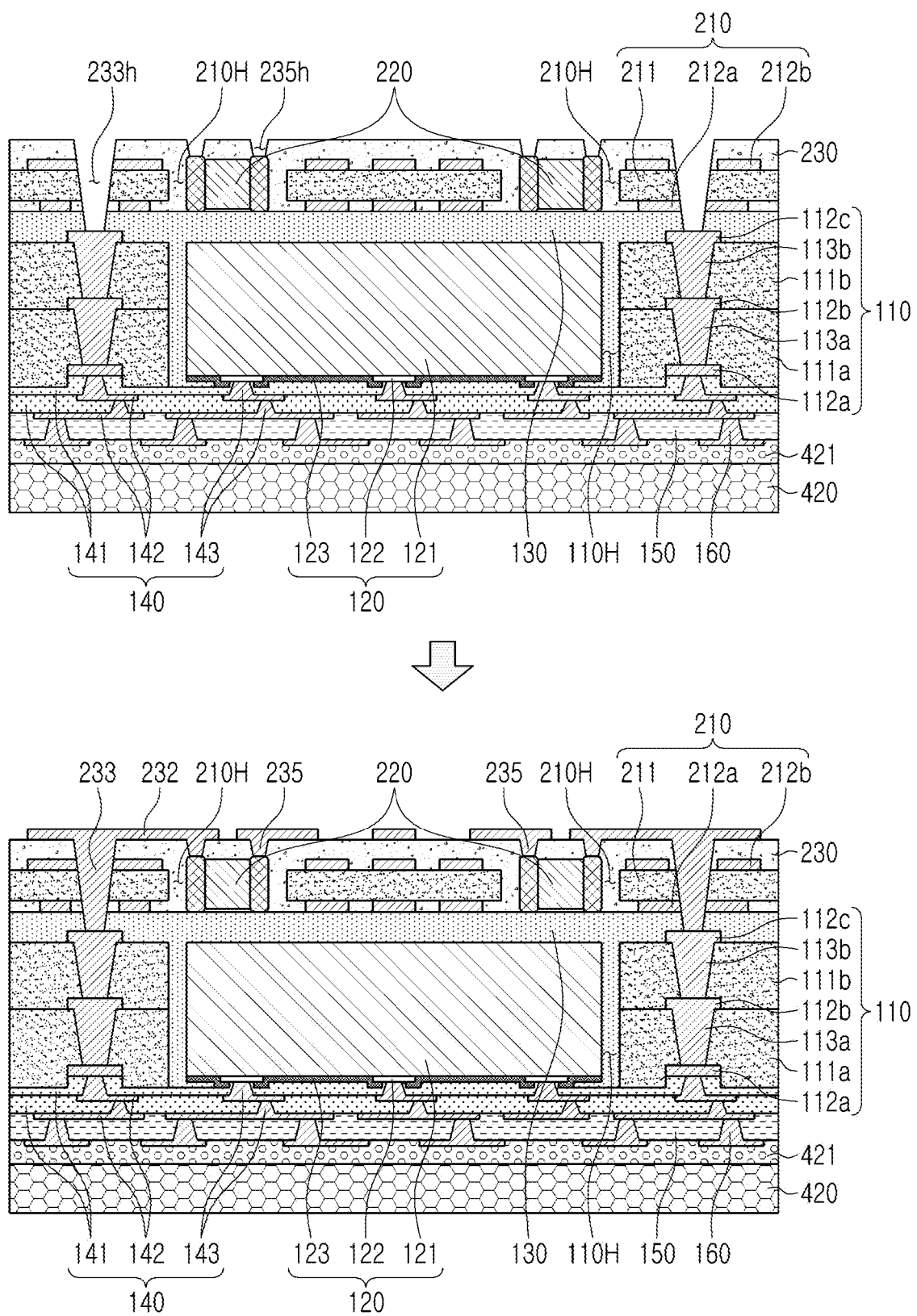

Then, referring to FIG. 14, first wiring via holes 233h penetrating through the second encapsulant 230, the second frame 210, and the first encapsulant 130 may be formed using the third conductor pattern layer 112c as a stopper layer. In addition, second via holes 235h penetrating through the second encapsulant 230 may be formed using the external electrodes of the passive components 220 as a stopper layer. Then, the backside wiring layer 232 and the first and second wiring vias 233 and 235 may be formed by a plating process.

Figure 15:
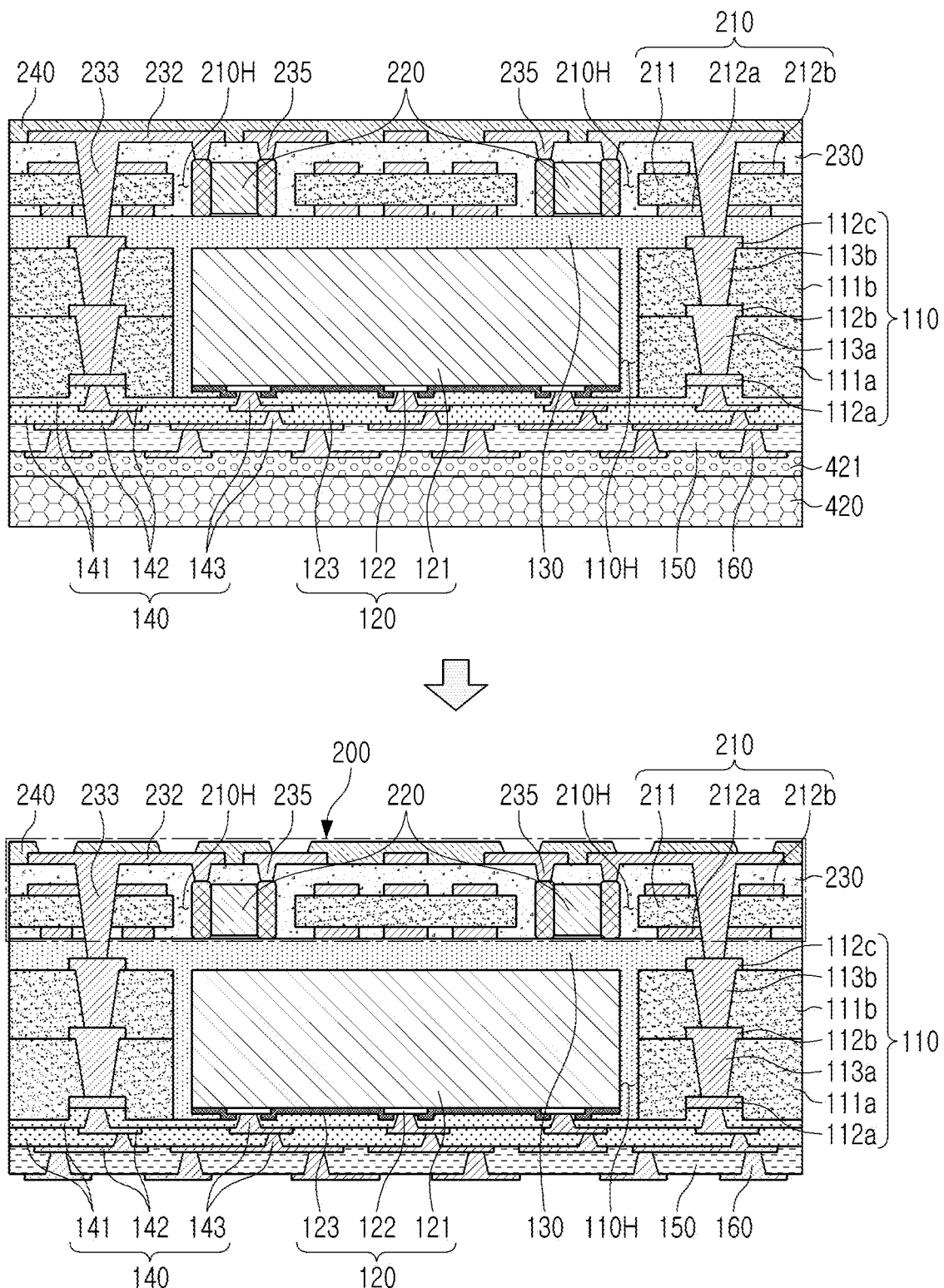

Then, referring to FIG. 15, the cover layer 240 covering the backside wiring layer 232 may be formed on the second encapsulant 230. The cover layer 240 may be formed by stacking and then hardening an ABF, or the like. Then, the second carrier 420 and the insulating layer 421 may be removed, and openings may optionally be formed in the cover layer 240. In this way, the semiconductor package (e.g., 300A) in which the wiring structure 200 is disposed to be integrated with the first encapsulant 130 may be manufactured through the described series of processes.

Figure 16:
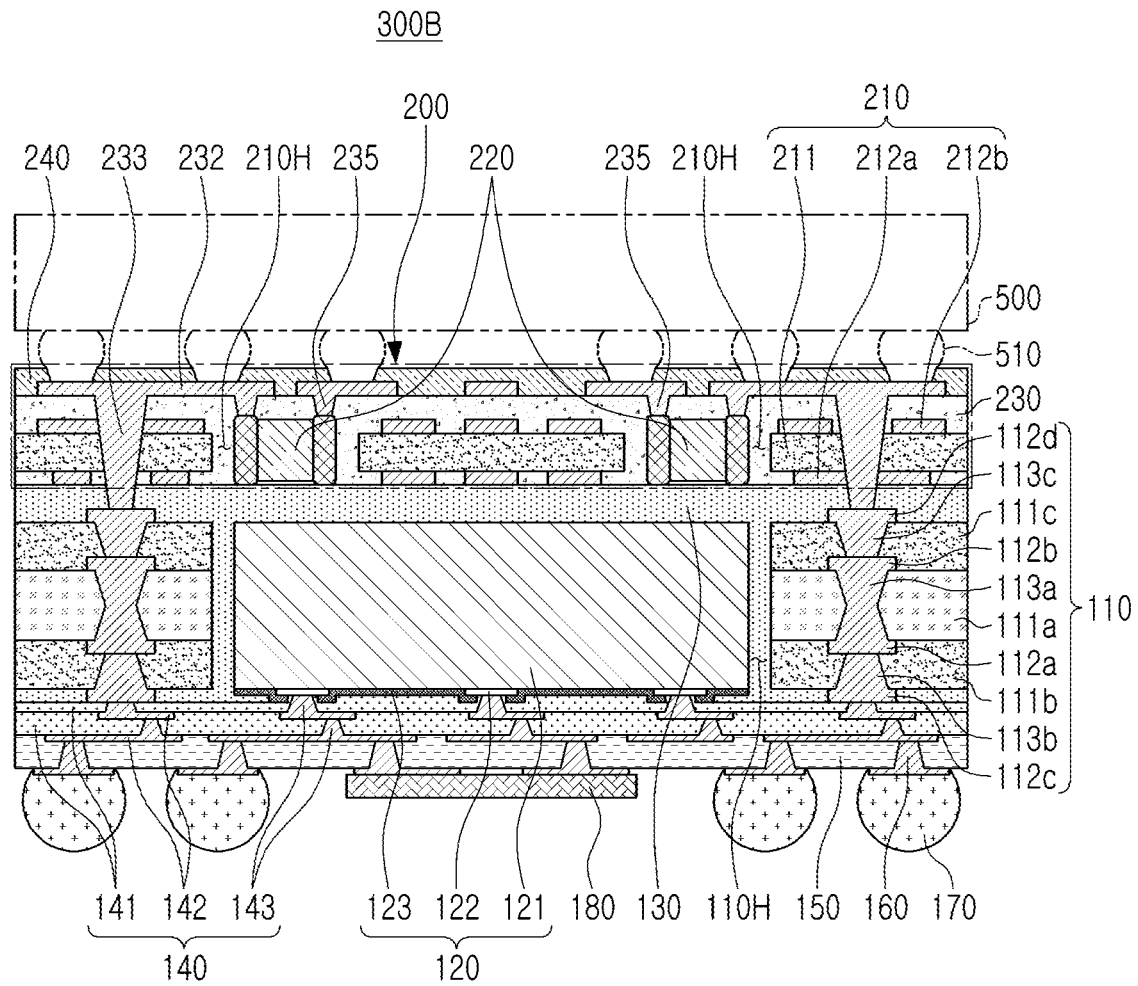
FIG. 16 is a schematic cross-sectional view illustrating a semiconductor package according to another exemplary embodiment in the present disclosure.

FIG. 16 is a schematic cross-sectional view illustrating a semiconductor package according to another exemplary embodiment in the present disclosure.

Referring to FIG. 16, a semiconductor package 300B according to another exemplary embodiment may be different in a form of a first frame 110 from the semiconductor package 300A according to the exemplary embodiment described above. In detail, the first frame 110 may include a first insulating layer 111a, a first conductor pattern layer 112a and a second conductor pattern layer 112b disposed on opposite surfaces of the first insulating layer 111a, respectively, a second insulating layer 111b and a third insulating layer 111c disposed on the opposite surfaces of the first insulating layer 111a, respectively, and covering the first conductor pattern layer 112a and the second conductor pattern layer 112b, respectively, a third conductor pattern layer 112c disposed on the other surface of the second insulating layer 111b opposing one surface of the second insulating layer 111b in which the first conductor pattern layer 112a is embedded, a fourth conductor pattern layer 112d disposed on the other surface of the third insulating layer 111c opposing one surface of the third insulating layer 111c in which the second conductor pattern layer 112b is embedded, first conductor vias 113a penetrating through the first insulating layer 111a and electrically connecting the first and second conductor pattern layers 112a and 112b to each other, second conductor vias 113b penetrating through the second insulating layer 111b and electrically connecting the first and third conductor pattern layers 112a and 112c to each other, and third conductor vias 113c penetrating through the third insulating layer 111c and electrically connecting the second and fourth conductor pattern layers 112b and 112d to each other. Since the first frame 110 may include a larger number of conductor pattern layers 112a, 112b, 112c, and 112d, a connection structure 140 may further be simplified.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of conductor pattern layers 112c and 112d. Similarly, the first conductor vias 113a penetrating through the first insulating layer 111a may have a height and an average diameter greater than those of second and third conductor vias 113b and 113c each penetrating through the second and third insulating layers 111b and 111c. In addition, the first conductor via 113a may have an hourglass shape or a cylindrical shape, while the second and third conductor vias 113b and 113c may have tapered shapes of which directions are opposite to each other. A thickness of each of the conductor pattern layers 112a, 112b, 112c, and 112d may be greater than that of each of redistribution layers 142.

Other contents overlap those described above in the semiconductor package 300A according to the exemplary embodiment, and a detailed description thereof is thus omitted.

As set forth above, according to an exemplary embodiment in the present disclosure, a semiconductor package of which a thickness may be reduced and in which electrical performance of a mounted memory package may be improved may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a semiconductor chip having connection pads on one surface thereof;
   a first encapsulant covering at least portions of the semiconductor chip;
   a connection structure disposed on the one surface of the semiconductor chip and including one or more redistribution layers electrically connected to the connection pads;
   a wiring structure disposed on one surface of the first encapsulant opposing another surface of the first encapsulant facing towards the connection structure, the wiring structure having a passive component embedded therein and including one or more wiring layers electrically connected to the passive component, and
   an electrical connection member electrically connected to the one or more redistribution layers and the one or more wiring layers,
   wherein the wiring structure includes:
      a second frame disposed on the first encapsulant, having a second through part, and including one or more core wiring layers, the passive component being disposed in the second through part,
      a second encapsulant covering at least portions of each of the second frame and the passive component,
      a backside wiring layer disposed on the second encapsulant,
      first wiring vias electrically connecting the backside wiring layer and the electrical connection member to each other, and
      second wiring vias electrically connecting the backside wiring layer and the passive component to each other,
   wherein the one or more wiring layers include the one or more core wiring layers and the backside wiring layer, and
   wherein the one or more redistribution layers and the one or more wiring layers are electrically connected to each other.

2. The semiconductor package of claim 1, wherein the wiring structure is disposed in physical contact with the one surface of the first encapsulant.

3. The semiconductor package of claim 1, further comprising:

a first frame having a first through part and including the electrical connection member,
wherein the semiconductor chip is disposed in the first through part.

4. The semiconductor package of claim 3, wherein the first frame includes a first insulating layer, a first conductor pattern layer in contact with the connection structure and embedded in the first insulating layer, a second conductor pattern layer disposed on another surface of the first insulating layer opposing one surface of the first insulating layer in which the first conductor pattern layer is embedded, first conductor vias penetrating through the first insulating layer and electrically connecting the first and second conductor pattern layers to each other, a second insulating layer disposed on the other surface of the first insulating layer and covering at least portions of the second conductor pattern layer, a third conductor pattern layer disposed on another surface of the second insulating layer opposing one surface of the second insulating layer in the which the second conductor pattern layer is embedded, and second conductor vias penetrating through the second insulating layer and electrically connecting the second and third conductor pattern layers to each other,
the one or more conductor pattern layers include the first to third conductor pattern layers, and
a surface of the first insulating layer in contract with the connection structure has a step with respect to a surface of the first conductor pattern layer in contact with the connection structure.

5. The semiconductor package of claim 3, wherein the first frame includes a first insulating layer, first and second conductor pattern layers disposed on opposite surfaces of the first insulating layer, respectively, first conductor vias penetrating through the first insulating layer and electrically connecting the first and second conductor pattern layers to each other, second and third insulating layers disposed on the opposite surfaces of the first insulating layer, respectively, and covering at least portions of the first and second conductor pattern layers, respectively, a third conductor pattern layer disposed on another surface of the second insulating layer opposing one surface of the second insulating layer in which the first conductor pattern layer is embedded, second conductor vias penetrating through the second insulating layer and electrically connecting the first and third conductor pattern layers to each other, a fourth conductor pattern layer disposed on another surface of the third insulating layer opposing one surface of the third insulating layer in which the second conductor pattern layer is embedded, and third conductor vias penetrating through the third insulating layer and electrically connecting the second and fourth conductor pattern layers to each other,
the one or more conductor pattern layers include the first to fourth conductor pattern layers, and
the first insulating layer has a thickness greater than that of each of the second and third insulating layers.

6. The semiconductor package of claim 1, wherein the first wiring vias penetrate through the second encapsulant, the second frame, and the first encapsulant, and
the second wiring vias penetrate through the second encapsulant.

7. The semiconductor package of claim 6, wherein the first wiring vias penetrate through at least portions of the core wiring layers, and
the first wiring vias and the core wiring layers are in contact with each other in penetration regions.

8. The semiconductor package of claim 1, wherein the wiring structure has a plurality of passive components, the second frame has a plurality of second through parts, and
a passive component of the plurality of passive components is disposed in each of the plurality of second through parts.

9. The semiconductor package of claim 1, wherein the wiring structure further includes a cover layer disposed on the second encapsulant and having openings exposing at least portions of the backside wiring layer.

10. The semiconductor package of claim 1, further comprising:
a passivation layer disposed on another surface of the connection structure opposing one surface of the connection structure on which the semiconductor ship is disposed and having openings exposing at least portions of the one or more redistribution layers;
underbump metal bumps disposed in the openings of the passivation layer and electrically connected to the exposed portions of the one or more redistribution layers; and
electrical connection metals disposed on the underbump metal bumps and electrically connected to the exposed portions of the one or more redistribution layers through the underbump metal bumps.

11. The semiconductor package of claim 10, further comprising:
an electronic component surface-mounted on another surface of the passivation layer opposing one surface of the passivation layer on which the connection structure is disposed and electrically connected to the one or more redistribution layers.

12. A semiconductor package comprising:
a connection structure having a first surface and a second surface opposing the first surface and including one or more redistribution layers;
a semiconductor chip disposed on the first surface of the connection structure and having connection pads electrically connected to the redistribution layer;
an electrical connection member disposed on the first surface of the connection structure and providing a vertical electrical connection path;
a first encapsulant disposed on the first surface of the connection structure and covering at least portions of each of the semiconductor chip and the electrical connection member;
a passive component disposed on the first encapsulant;
a second encapsulant disposed on the first encapsulant and covering at least portions of the passive component;
a backside wiring layer disposed on the second encapsulant;
first wiring vias penetrating through the first and second encapsulants and electrically connecting the backside wiring layer and the electrical connection member to each other; and
second wiring vias penetrating through the second encapsulant and electrically connecting the backside wiring layer and the passive component to each other.

13. The semiconductor package of claim 12, wherein the first wiring via has a height greater than that of the second wiring via.

14. The semiconductor package of claim 12, further comprising a frame disposed on the first encapsulant, at least partially covered with the second encapsulant, and having a through part in which the passive component is disposed, wherein the frame includes one or more core wiring layers electrically connected to the backside wiring layer and the electrical connection member through the first wiring vias.

15. A semiconductor package comprising:
a semiconductor chip having opposing first and second surfaces, and having connection pads on the first surface;
an encapsulant disposed on the second surface of the semiconductor chip; and
a wiring structure disposed on the encapsulant, having a passive component embedded therein, and including at least one conductive via penetrating therethrough and through the encapsulant,
wherein the wiring structure has opposing first and second surfaces, the first surface of the wiring structure facing the second surface of the semiconductor chip, the wiring structure further comprising:
a backside wiring layer disposed in the wiring structure between the passive component and the second surface of the wiring structure, and contacting the at least one conductive via.

16. The semiconductor package of claim 15, wherein the wiring structure further comprises:
a cover layer disposed on the backside wiring layer on the second surface of the wiring structure, and having a plurality of openings exposing portions of the backside wiring layer.

17. The semiconductor package of claim 16, further comprising:
a connection structure disposed on the first surface of the semiconductor chip, and having insulating layers, conductive redistribution layers and conductive connection vias embedded in the insulating layers, the conductive connection vias contacting the connection pads of the semiconductor chip and the conductive redistribution layers electrically connecting the connection pads to the least one conductive via of the wiring structure.

18. The semiconductor package of claim 17, further comprising:
a frame disposed on the connection structure, having a through-hole with the semiconductor chip disposed therein, and having one or more conductor pattern layers electrically connecting the connection pads to the least one conductive via of the wiring structure,
wherein the encapsulant extends into the through-hole between the frame and the semiconductor chip, and
the at least one conductive via penetrates through the wiring structure and the encapsulant to contact the one or more conductor pattern layers of the frame.

19. The semiconductor package of claim 15, further comprising:
a connection structure disposed on the first surface of the semiconductor chip, and having insulating layers, conductive redistribution layers and conductive connection vias embedded in the insulating layers, the conductive connection vias contacting the connection pads of the semiconductor chip and the conductive redistribution layers electrically connecting the connection pads to the least one conductive via of the wiring structure.

* * * * *